(12) United States Patent
Bader et al.

(10) Patent No.: US 6,428,335 B1
(45) Date of Patent: Aug. 6, 2002

(54) BUS BAR WITH TERMINAL INSULATOR AND CONNECTOR GUIDE THEREFOR

(75) Inventors: Craig C. Bader; Robert A. Norman, Jr., both of Rochester, NY (US)

(73) Assignee: Eldre Corporation, Rochester, NY (US)

( * ) Notice: Subject to any disclaimer, the term of this patent is extended or adjusted under 35 U.S.C. 154(b) by 0 days.

(21) Appl. No.: 09/845,802

(22) Filed: Apr. 30, 2001

(51) Int. Cl.⁷ .................................................. H01R 4/60
(52) U.S. Cl. ...................................... 439/213; 439/951
(58) Field of Search ................................ 439/212, 951, 439/210, 213; 174/68.2, 70 B, 71 B, 72 B, 88 B

(56) References Cited

U.S. PATENT DOCUMENTS

| | | | | |
|---|---|---|---|---|
| 3,555,293 A | * | 1/1971 | Shannon et al. | ........... 174/68.3 |
| 4,303,291 A | * | 12/1981 | Dines | |
| 4,806,103 A | * | 2/1989 | Kniese et al. | ................. 439/60 |

FOREIGN PATENT DOCUMENTS

JP           2-125489       *   5/1990

* cited by examiner

*Primary Examiner*—Neil Abrams
(74) *Attorney, Agent, or Firm*—Shlesinger, Fitzsimmons & Shlesinger

(57) ABSTRACT

A laminated bus bar has thereon a male terminal formed either from only two electric strip conductors separated by a layer of insulation, or from two groups of conductors separated by a layer of insulation. When only two conductors are employed, one may be slightly longer and wider than the other, and the terminal section of the one conductor has a marginal edge portion thereof extending beyond the edge of the registering terminal section of the other conductor. Both terminal sections of the two conductors have exposed outer surfaces forming a male terminal disposed to be inserted releasably into a female receptacle of an electric circuit, and a dielectric insulator barrier is secured on and covers the marginal edge portion of the terminal section of the one conductor and overlies the edge of the other terminal section. When each terminal section constitutes a group of spaced, parallel conductors one of two, like insulator barriers is secured to each side of the insulation separating the two groups, and has in one edge thereof spaced notches for accommodating and covering the edges of all conductors in the registering group thereof.

12 Claims, 4 Drawing Sheets

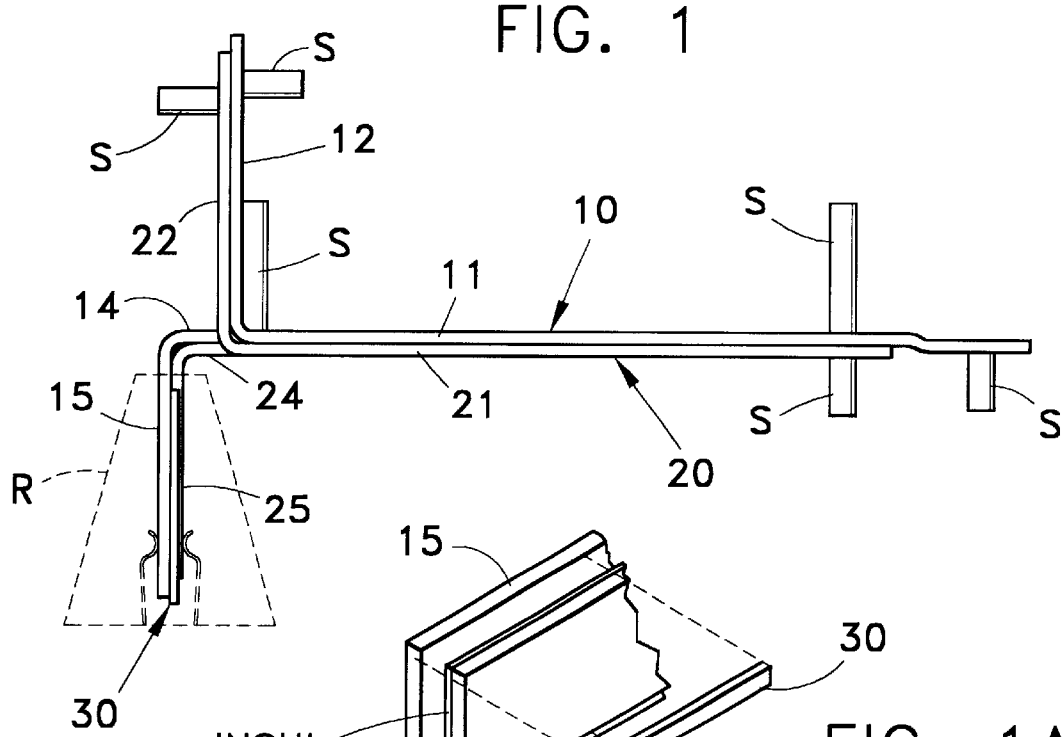
FIG. 1
FIG. 1A
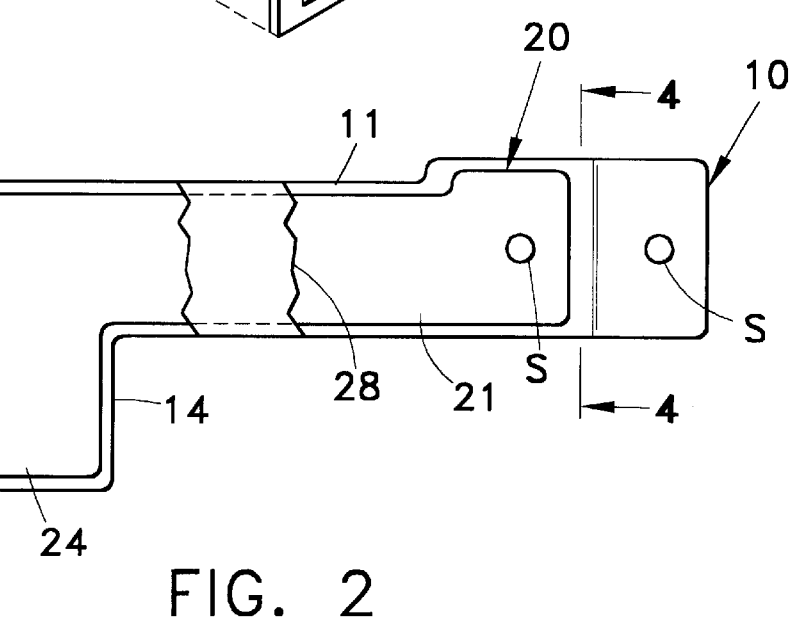
FIG. 2

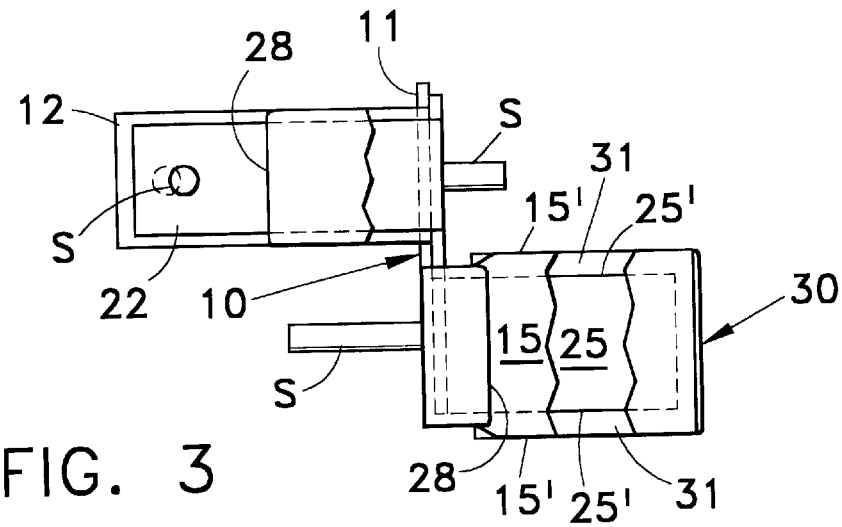
FIG. 3
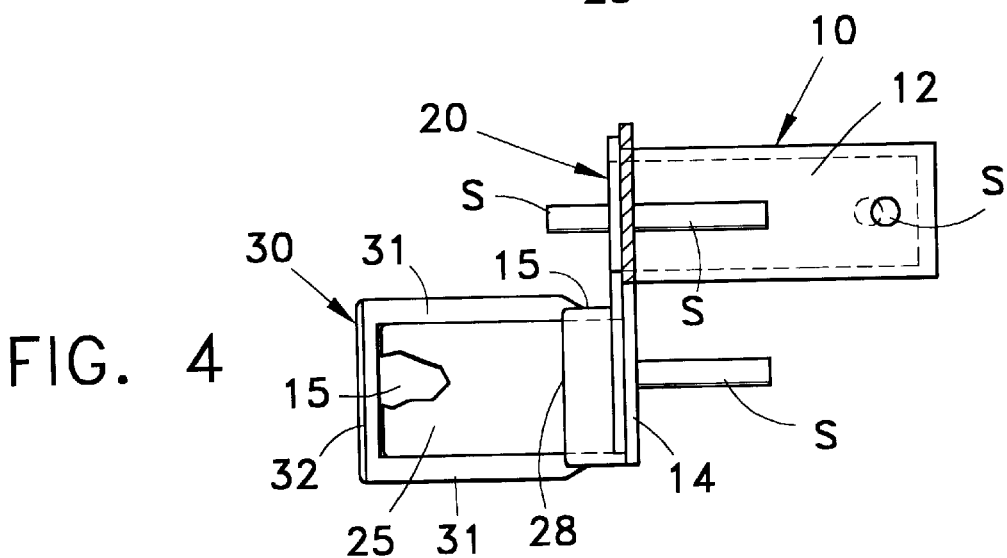
FIG. 4
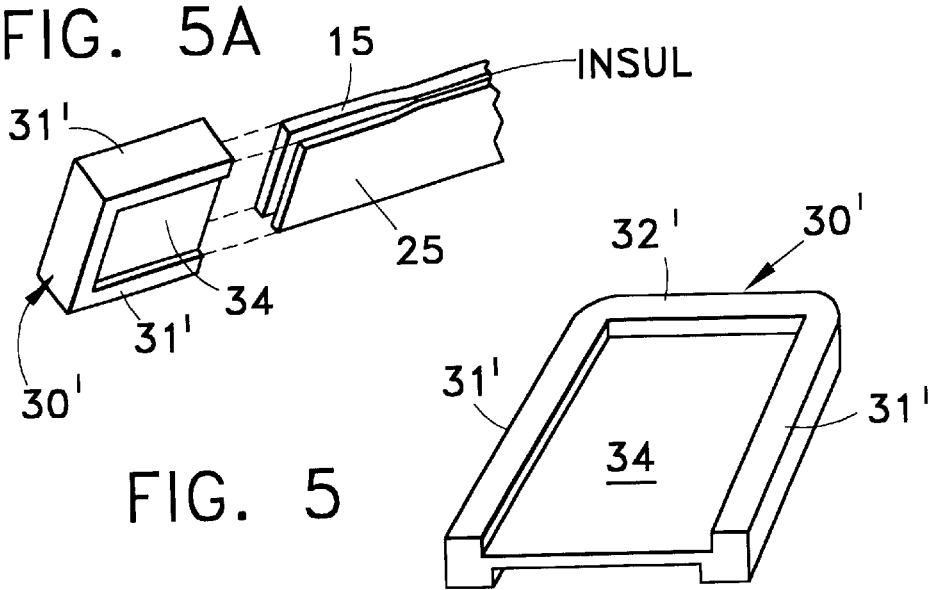
FIG. 5A
FIG. 5

BUS BAR WITH TERMINAL INSULATOR AND CONNECTOR GUIDE THEREFOR

BACKGROUND OF THE INVENTION

This invention relates to laminated bus bars designed for use with electrical power or signal connectors such as the split crown band type, and more particularly to an improved such bar having a male terminal covered by a novel insulation barrier to prevent undesirable shorting of the bus conductors when the terminal is operative in the connector, and to effect proper alignment with the associated connector.

It has long been customary to employ in electrical bus bars elongated strips of insulation between adjacent conductor strips or buses in the bar, including those sections of the strips that are shaped to form terminals which are employed for releasably connecting one circuit to another. One of the major problems heretofore encountered with bus bars designed for use with connectors of the split crown band variety, has been the difficulty in properly insulating a negative bus in the bar from the associated positive bus. Normally these two buses are separated from one another by an intervening layer of insulation, which is secured between the confronting surfaces of the two buses. However, a major problem is encountered when registering end portions of the two buses are designed to form a male terminal for connection with a power supply, such as for example when the terminal has exposed outer surfaces disposed to be releasably inserted into a female receptor or connector of the crown band variety. In such instance, the insulation that is disposed between the two confronting surfaces of the positive and negative bus conductors, frequently does not provide the necessary insulation for preventing undesirable shorting when the male terminal is inserted into or withdrawn from a female type connector.

Still another problem is often encountered when the bus bar includes multiple strip conductors having two or more male terminals designed to be inserted into a common female connector. This problem is exasperated when each terminal comprises a plurality of spaced contacts which must register properly with corresponding contacts in the connector.

It is an object of this invention, therefore, to provide for use with connectors of the type described, an improved bus bar in which a special novel insulator barrier is employed between and immediately adjacent to the end portions of a pair of conductor strips which are employed to form the male terminal of the bar.

Another object of this invention is to provide for a bus bar of the type described a generally U-shaped insulation barrier which is designed to supplement the insulation between the ends of the positive and negative buses that are to be employed to form a male terminal for connecting the bus bar to the female connector of another circuit.

Still another object of this invention is to provide for bus bars of the type having multiple male terminals for insertion into a common connector, improved insulation barriers which function also to guide spaced contacts of the terminals to engagement with corresponding contacts in the connector.

Other objects of this invention will be apparent hereinafter from the specification and from the recital of the appended claims, particularly when read in conjunction with the accompany drawings.

SUMMARY OF THE INVENTION

The laminated bus bar includes at least two metal strip conductors one of which may be slightly longer and wider than the other, so that when they are laminated together with a layer of insulation therebetween, a marginal edge portion of one conductor extends slightly beyond the edge of the other conductor. One of the two conductors comprises a single contact terminal section overlying a registering one-contact terminal section of the other conductor, or a multiple contact terminal overlying a registering multiple contact terminal of the other conductor, the registering terminal sections having exposed outer surfaces and forming a male terminal disposed to be inserted releasably into a female receptacle or connector of an electric circuit. To prevent the registering one-contact terminals from shorting such circuit, a generally U-shaped dielectric insulator barrier is secured to a marginal edge portion of one of the terminal sections that extends beyond the edge of the other terminal section. For each multiple contact terminal, a dielectric insulator barrier is secured over the end thereof which is inserted into the connector, the barrier having thereon spaced projections which extend between the spaced contacts of the respective terminal.

THE DRAWING

FIG. 1 is a top plan view of an improved bus bar and terminal insulator therefor made according to one embodiment of this invention;

FIG. 2 is a front elevational view of this bus bar;

FIG. 3 is an end elevational view looking at the left end of the bus bar as shown in FIG. 2;

FIG. 4 is an end elevational sectional view taken along the line 4—4 in FIG. 2 looking in the direction of the arrows;

FIG. 5 is a perspective view of a modified form of the terminal insulator employed on the male terminal portion of this bar;

Figure 6:
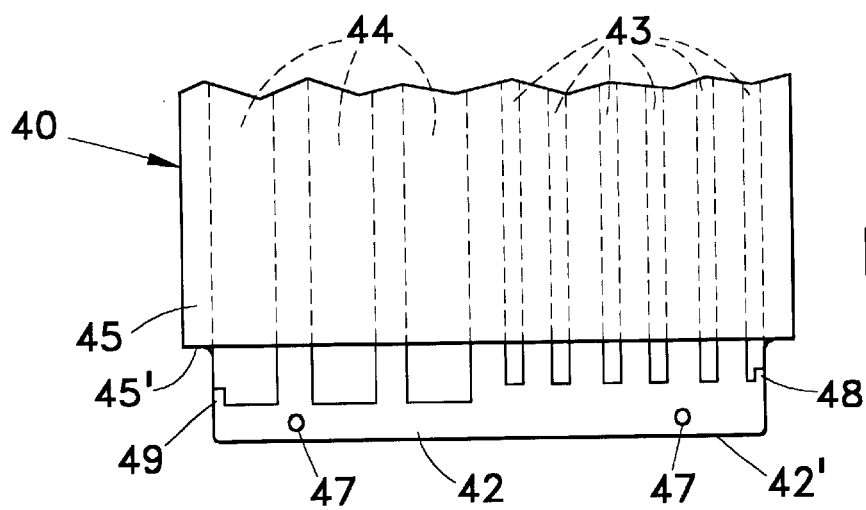
FIG. 6 is a fragmentary plan view of one side of the bus bar and a multiple contact terminal thereof forming part of a second embodiment of this invention.
Figure 7:
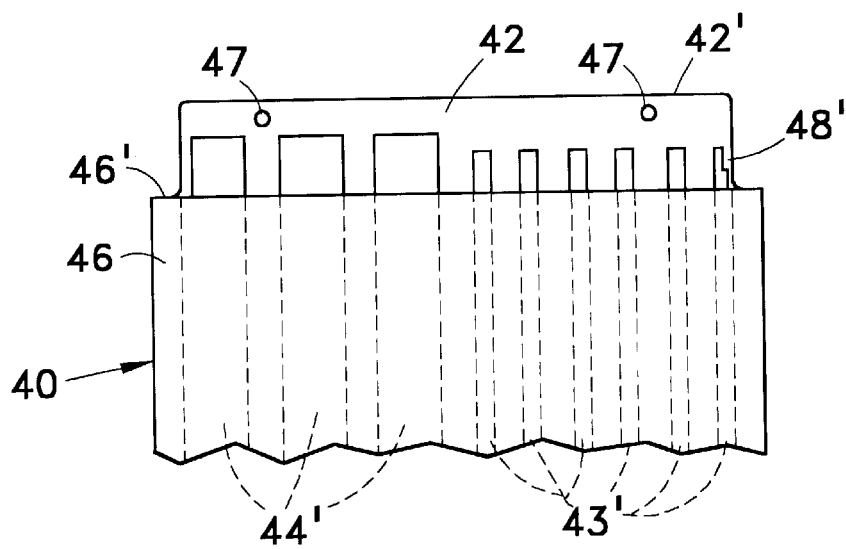
FIG. 7 is a plan view of the other side of this terminal.
Figure 8:
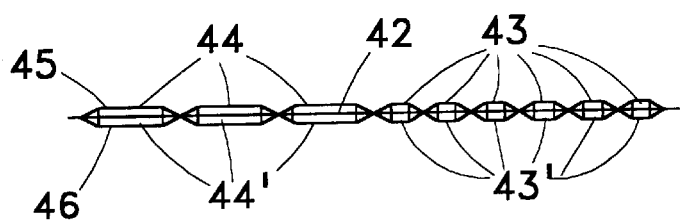
FIG. 8 is a schematic end view of this terminal when looking at the lower end of the terminal as shown in FIG. 6.
Figure 9:
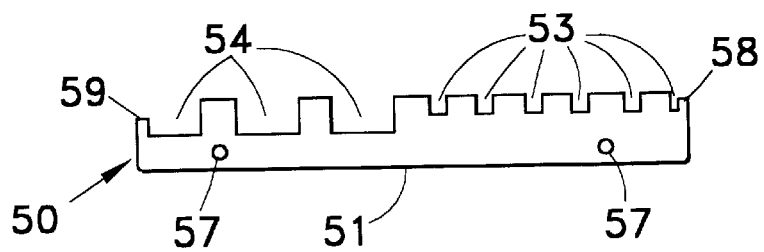
Figure 10:
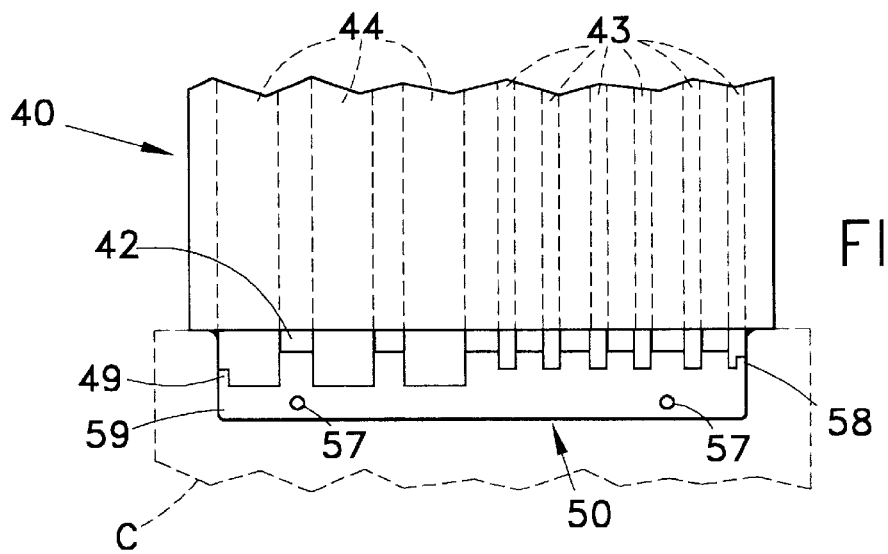
Figure 11:
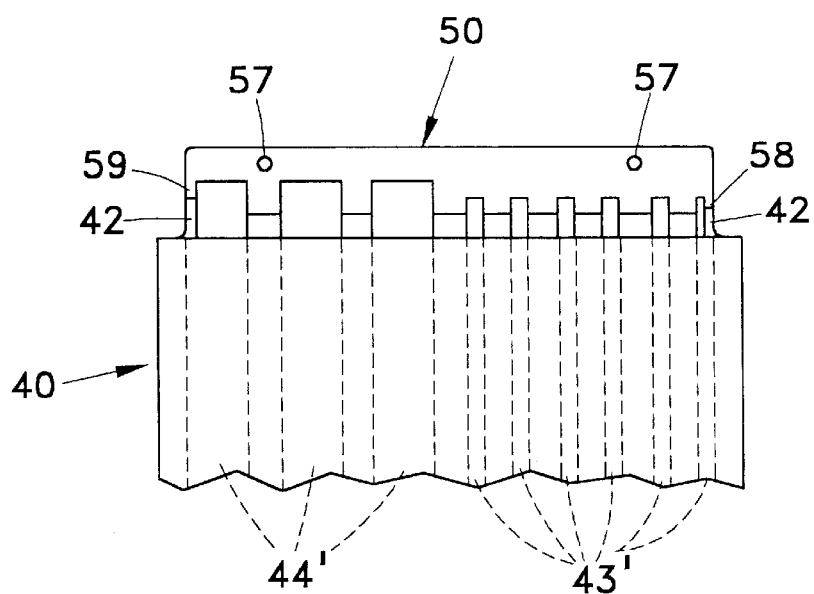
Figure 12:
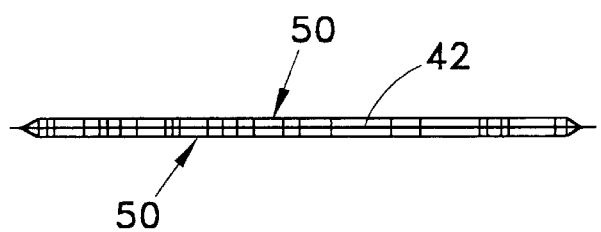

FIG. 9 is a plan view of an insulator barrier one each of which is disposed to be secured over the ends of the multiple contacts of the terminal at each side thereof, FIGS. 10 and 11 are similar to FIGS. 6 and 7, respectively, but illustrating also an insulator barrier of the type shown in FIG. 9 secured over the ends of the multiple contacts at each side of the terminal and with a connector shown in phantom by broken lines in FIG. 10, and FIG. 12 is a schematic end view of the terminal with the insulator barriers secured thereon.

PREFERRED EMBODIMENTS OF THE INVENTION

Referring now to the drawings by numerals of reference, the illustrated bus bar comprises two specially shaped metal strips or conductors that are laminated together with registering, confronting surfaces thereof being insulated from each other in known manner by intervening layers of dielectric material (not illustrated). One such conductor is referred to as the plus assembly as denoted generally by the numeral 10, and the other (the negative assembly) is denoted by the numeral 20. While the conductor strips 10 and 20 are generally similar in configuration, strip 10 is slightly larger (longer and wider) than the strip 20. Strip 10 has an elongated center section which overlies and registers with, and is insulated from, a confronting surface of a center section 21 of the strip 20. Adjacent one end thereof (the left ends in FIG. 1) strips 10 and 20 have formed therein right angular bends which form thereon offset sections 12 and 22 which extend at right angles to the sections 11 and 21, respectively. A plurality of metal studs S are secured to and project from various sections of strips 10 and 20 for mounting purposes which form no part of this invention.

Adjacent their offset sections 12 and 22 each of the center sections 11 and 21 of the strips 10 and 20 has integral with and projecting laterally from one side thereof, and in overlapping relation to one another, laterally offset sections 14 and 24, respectively. Sections 14 and 24 extend beyond the offset sections 12 and 22 and have formed therein just beyond sections 12 and 22, right angular bends which form at one end of each of sections 14 and 24 (the left ends thereof as shown in FIGS. 1 and 2) offset sections 15 and 25, respectively, which extend at right angles relative to sections 14 and 24 in the direction opposite to that of the offset sections 12 and 22 of strips 10 and 20, and downwardly as shown in FIG. 1. Intermediate its ends strip 20 has secured over its outer surface and opposed side edges a layer of insulation 28 (shown fragmentarily in FIGS. 2 and 3) which extends part way over sections 22 and 25.

The overlapping sections 15 and 25 of the conductors have exposed outer surfaces which form the active male terminal or connector portion of strips 10 and 20, and in use are disposed to be movably and slidably inserted into a conventional female connector or receptacle R (shown in phantom by broken lines in FIG. 1) which forms part of the power supply circuit to which the illustrated bus bar is disposed to be connected, but which receptacle forms no part of this invention. For this reason the exterior surfaces of sections 15 and 25—i.e. the surfaces engaged by the conductors in the receptacle R—are plated for example with gold or nickel. Also, to prevent any undesirable shorting between the exposed edges of sections 15 and 25 when in the receptacle R, a generally U-shaped insulator barrier 30 made from a dielectric material, such as for example that which is sold under the mark FIBERGLAS, is secured upon and covers the marginal edge portions of section 15 that extend beyond the edges of section 25.

For example, as shown in FIG. 3, the portion of section 15 disposed to be inserted into receptacle R has spaced, parallel side edges 15' which project substantially equidistantly beyond the opposed side edges 25' of the section 25. Also as shown in FIGS. 3 and 4, the outer end of section 15 (the end remote from section 14) extends slightly beyond the outer end of section 25. It is these exposed side and outer end portions of section 15 which have secured thereto, and are covered by, the spaced, parallel legs 31 and end section 32 of the U-shaped barrier 30. While the strips 10 and 20 are of equal thickness, the barrier 30 has a thickness slightly more or less than each conductor 10, 20 so that, when secured in place as shown more clearly in FIG. 1, the barrier surrounds and overlies a substantial portion of the edge of section 25.

From the foregoing it will be apparent that the generally U-shaped barrier 30 provides additional, and very effective means for insulating marginal edge portions of sections 15 and 25 of the conductors 10 and 20 from one another, and also provides means for insulating the otherwise exposed side edges 25', and the end edge of section 25, thereby to prevent any undesirable shorting of a circuit when the male terminal section of assembly 10 is inserted into or withdrawn from the receptacle in another circuit. Also, while the barrier 30 has been illustrated and described as being generally U-shaped in configuration, it will be apparent, if desired, the two spaced, parallel leg sections 31 of the barrier could be made separate from the end section 32 of the barrier, in which case three separate sections 31, 31' and 32 would be employed to form a generally U-shaped barrier having a configuration similar to that shown in FIG. 4 of the drawing. Alternatively, as shown in FIG. 5, the legs 31' and section 32' of barrier 30' could be integral with and connected by a thin layer 34 of the same dielectric material, which layer during the laminating process would be disposed between overlapping sections 15 and 25 of the assembly. Ultimately, when secured to the connector the barrier 30' will have its opposed, parallel leg or side sections 31', and its transversely extending end section 32', secured against the opposed side edges 25' and the end edge of section 25 and also would be secured against and would cover the marginal edge portions of section 15 which overlie and extend beyond the corresponding edges of section 25.

Referring now to the embodiments shown in FIGS. 6 to 12, 40 denotes generally a multiple contact type terminal of a laminated bus bar comprising an elongate, rectangularly shaped and centrally disposed layer of insulation having secured to one side thereof as shown in FIG. 6, six nearly identical elongate, narrow, parallel conductors or contacts denoted by the numerals 43, and three nearly identical but wider, parallel conductors 44. Secured to the opposite side of layer 42 is a second, generally like group of elongate, spaced, parallel conductors including six nearly alike narrow conductors 43' which register with the conductors 43 at the opposite side of the layer 42 and three, generally alike, rectangularly shaped conductors 44' which are similar to and register with the conductors 44 at the opposite side of layer 42. The foregoing groups of conductors are laminated to the opposite surfaces of layer 42 between two outer, registering layers 45 and 46 of insulation, which are slightly shorter than the overall lengths of the two groups of conductors 43, 44 and 43' 44', as well as the central layer 42 of insulation disposed between the two groups of conductors. However, as shown in FIGS. 6 and 7, the central insulation layer 42 extends beyond the registering, terminal ends 45' and 46' of the conductors 45 and 46 for a distance greater than the extent to which the conductors 43 and 44 and 43' and 44' extend beyond ends 45' and 46' of the outer layers of insulation. The portions of the conductors 43 and 44, and 43' and 44' which extend beyond the ends 45' and 46' of the outer layers of insulation are therefore exposed, and as noted hereinafter, are disposed to be inserted into a female connector. The portion of the insulation layer 42, which extends beyond the outer or terminal ends of the exposed portions of the metal conductors has therethrough a pair of small circular openings 47 a purpose of which will be noted hereinafter.

The narrow conductor 43, which is immediately adjacent to the right hand edge of layer 42 as shown in FIG. 6, has an outer, exposed edge, which registers exactly with the corresponding side edge of layer 42, and which has in its outer end a small rectangular notch 48. Along the other side edge of layer 42 the outermost conductor 44 has its exposed, left hand edge as shown in FIG. 6 in exact registry with the left hand edge of layer 42, and has in its outer end a small rectangular notch 49. Referring now to FIG. 7, the outermost conductor 43', which registers with the notched conductor 43, also has in its outer end a rectangularly shaped notch 48', but notably, the outer, exposed end of that particular conductor 43' is slightly narrower than the registering conductor 43, so that the right hand side edge of layer 42 extends slightly beyond the adjacent side edge of the outer conductor 43'. Also as shown in FIG. 7 the exposed, outer end of the outermost or left end conductor 44' is narrower than the registering end of the conductor 44 in the first group of conductors, so that once again the central layer 42 of insulation extends slightly beyond the left hand edge of the outer conductor 44' as shown in FIG. 7.

Referring now to FIG. 9, 50 denotes generally one of two identical insulator barriers, which are secured to opposite sides of layer 42 as shown in FIGS. 10 and 11. Each barrier 50 has a straight, planar lower edge 51, and has in its upper edge six small, rectangularly shaped, laterally spaced notches or recesses 53 for accommodating the ends of conductors 43 and 43', as shown in FIGS. 10 and 11, and three rectangularly shaped, larger notches 54 which are located adjacent the opposite end of each insulator 50 to accommodate the exposed, terminal ends of the conductors 44 and 44' also as shown in FIGS. 10 and 11. Each insulator 50 also has therethrough adjacent opposite ends thereof a pair of small, circular openings 57 which are disposed to register with the openings 48 in the insulation layer 42, when the insulators 50 are secured to layer 42 as shown in FIGS. 10 and 11. Notably also in FIG. 9, the portion 58 of member 50 which defines the outer or right side of the first small notch 53 in member 50 is shorter than the portions of the insulator defined in the remaining sidewalls of the notches 53, while at the opposite or left end of insulator 50, the portion 59 thereof defining the outer or left side of the first notch 54 in the upper side of the insulator likewise is shorter than the sidewalls of the remaining notches 54. The purpose of employing the portions 58 and 59 in each insulator 50 is so that when the insulator 50 is secured to the side of the insulation layer 42 which projects beyond the exposed, terminal ends of the conductors 43 and 44 as shown in FIG. 10, the portion 58 of the insulation barrier 50 will seat in the notch 48 in the outer conductor 43, while the portion 59 of the insulator will seat in the notch 49 formed in the exposed, terminal end of the outermost conductor 44. On the other hand, when an insulator barrier is secured to the opposite side of the central insulation layer 42 to cover the outer ends of the conductors 43' and 44' as shown in FIG. 11, portion 59 of the insulator will simply extend part way along one side of the exposed end of the outer conductor 44', while portion 58 of this insulator 50 will extend part way along the outer edge of the outermost conductor 43'.

The advantage of this construction is that when the insulator barriers 50 are secured to opposite sides of layer 42 to cover the outer, terminal ends of the two groups of conductors 43, 44, 43' and 44' the sides of the recesses in the barriers 50, which enclose the terminal ends of the conductors, prevent any undesirable lateral shifting of the conductors, so that when the terminal 40 is releasably inserted into a conventional female connector C, such as shown in phantom by broken lines in FIG. 10, the exposed, terminal ends of the conductors are guided correctly into engagement with the corresponding conductors in the connector C. Not only does the presence of the two insulator barriers 50 assure proper connection of the two groups of conductors of the terminal 40 and the corresponding conductors in the connector C, but the exposed, outer edges of the outermost conductors 44 and 43 at one side of the insulation layer 42, have exposed edges thereof terminating in the notches 48 and 49, which provide accurate guiding surfaces for the entry of the terminal into the connector C. Also, since the openings 57 in the insulator barriers register with the openings 47 in the central insulating layer 42, if desired, the assembled terminal 40 and the attached barriers 50 could have centering or fastening means in the registering openings if desired.

While this invention has been illustrated and described in detail in connection with only certain embodiments thereof, it will be apparent that it is capable of still further modification, and that this application is intended to cover any such modifications as may fall within the scope of one skilled in the art, or within the scope of the appended claims.

What is claimed is:

1. An electrical bus bar, comprising a plurality of electric strip conductors laminated together with confronting surfaces thereof being insulated from each other by at least one intervening layer of dielectric insulation, at least one of said conductors having a terminal section at one end thereof overlying and laminated to a registering terminal section on one end of at least one other of said conductors, each of said registering terminal sections of the laminated conductors having exposed edges and outer surfaces operatively forming on the bus bar a male terminal disposed to be inserted releasably into a female connector of an electric circuit, and a dielectric insulator barrier having therein a generally U-shaped recess, and having the edges thereof defining said recess secured over and covering said exposed edges of at least one of said registering terminal sections.

2. An electrical bus bar as defined in claim 1, wherein the other terminal section that registers with said one terminal section has a marginal edge portion thereof extending beyond the edge of said one terminal section, and said insulator barrier is similar in configuration to and is secured to said marginal edge portion of the terminal section of said other terminal section.

3. An electrical bus bar as defined in claim 1, wherein said exposed outer surfaces of said registering terminal sections are metal plated.

4. An electrical bus bar as defined in claim 2, wherein said insulator barrier has a thickness more or less than that of said one terminal section, and overlies a substantial portion of said marginal edge of said other terminal section.

5. An electrical bus bar as defined in claim 1, wherein said insulator barrier is made of FIBERGLASS.

6. An electrical bus bar as defined in claim 1 wherein said insulator barrier and said marginal edge portion of said other terminal section are generally U-shaped in configuration.

7. An electrical bus bar as defined in claim 2, wherein said insulator barrier comprises a pair of spaced, parallel leg sections disposed to overlie and cover said marginal edge portion of said one terminal section, and having a thin central section integral with and extending between said leg sections, and said central section of said barrier disposed to be laminated between said registering terminal sections.

8. An electrical bus bar as defined in claim 1, wherein a plurality of said conductors are laminated to each side of said intervening layer of insulation with the conductors at each side of said layer having spaced, parallel terminal sections extending parallel to each other and to opposed side edges of said layer, and being similar to and registering with the terminal sections of the conductors on the opposite side of said layer, a marginal edge portion of said layer extends beyond the ends said registering terminal sections of said conductors, and two of said dielectric insulator barriers are secured to opposite sides, respectively, of said marginal edge portion of said layer operatively to register with and to cover exposed edges of the ends of said terminal sections at each side of said layer.

9. An electrical bus bar as defined in claim 8, wherein each of said insulation barriers has an elongate edge thereof having therein a plurality of spaced recesses equal in number to, and registering with, the ends of the terminals on the side of said layer to which the respective barrier is secured, and the ends of the terminals at each side of said layer extend into said recesses in the registering barrier.

10. An electrical bus bar as defined in claim 9, wherein at one side of said layer the two terminals adjacent to said opposed side edges of said layer have exposed portions of their outer edges which register with the opposed side edges of said layer, and at the opposite side of said layer the terminals adjacent to said opposed side edges of said layer have exposed outer edges spaced inwardly from the opposed side edges of said layer.

11. An electrical bus bar as defined in claim 10, wherein each of said two terminals at said one side of said layer have shallow notches formed in the outer ends thereof, and opening on the outer edges thereof, and the insulation barrier on said one side of said layer has in opposite ends thereof projections which extend into said notches in said two terminals.

12. An electrical bus bar as defined in claim 10, wherein each of said two terminals at said one side of said layer is slightly wider than the registering terminal secured to the opposite side of said layer.

* * * * *